United States Patent [19]
Levine

[11] 3,931,463
[45] Jan. 6, 1976

[54] SCENE BRIGHTNESS COMPENSATION SYSTEM WITH CHARGE TRANSFER IMAGER

[75] Inventor: Peter Alan Levine, Kendall Park, N.J.

[73] Assignee: RCA Corporation, N.Y.

[22] Filed: July 23, 1974

[21] Appl. No.: 491,114

[52] U.S. Cl. .................. 178/7.1; 357/24; 357/30
[51] Int. Cl.² ................ H04N 3/14; H01L 29/78; H01L 31/00
[58] Field of Search ...... 178/7.1, DIG. 42; 250/209, 250/211 R, 211 J, 208, 578; 357/30, 24

[56] References Cited
UNITED STATES PATENTS

| | | |
|---|---|---|
| 3,715,485 | 2/1973 | Weimer .............................. 357/24 |
| 3,771,149 | 11/1973 | Collins et al. ........................ 357/24 |
| 3,777,061 | 12/1973 | Takemura ........................... 178/7.1 |
| 3,826,926 | 7/1974 | White et al. .......................... 357/24 |
| 3,845,295 | 10/1974 | Williams et al. ................. 250/211 J |
| 3,851,096 | 11/1974 | Collins et al. ........................ 357/24 |
| 3,863,065 | 1/1975 | Koscnocky et al. ............. 250/211 J |

Primary Examiner—Benedict V. Safourek
Assistant Examiner—John C. Martin
Attorney, Agent, or Firm—H. Christoffersen; S. Cohen

[57] ABSTRACT

The contents of the photosensing array of a charge coupled device (CCD) imager is transferred to a drain region during a portion of each integration time proportional to the scene's brightness. Such transfer is accomplished by shifting the accumulated charge in the backward direction along the columns to the drain region.

8 Claims, 8 Drawing Figures

SCENE BRIGHTNESS COMPENSATION SYSTEM WITH CHARGE TRANSFER IMAGER

In imaging systems employing imaging tubes, it is common practice to compensate electronically for changes in scene brightness by adjusting the gain of the tube. Such compensation does not require the use of a mechanical iris. The present application deals with apparatus for achieving the same effect in a charge transfer system such as one of the charge coupled device (CCD) type.

The invention is illustrated in the drawing of which:

Figure 1:
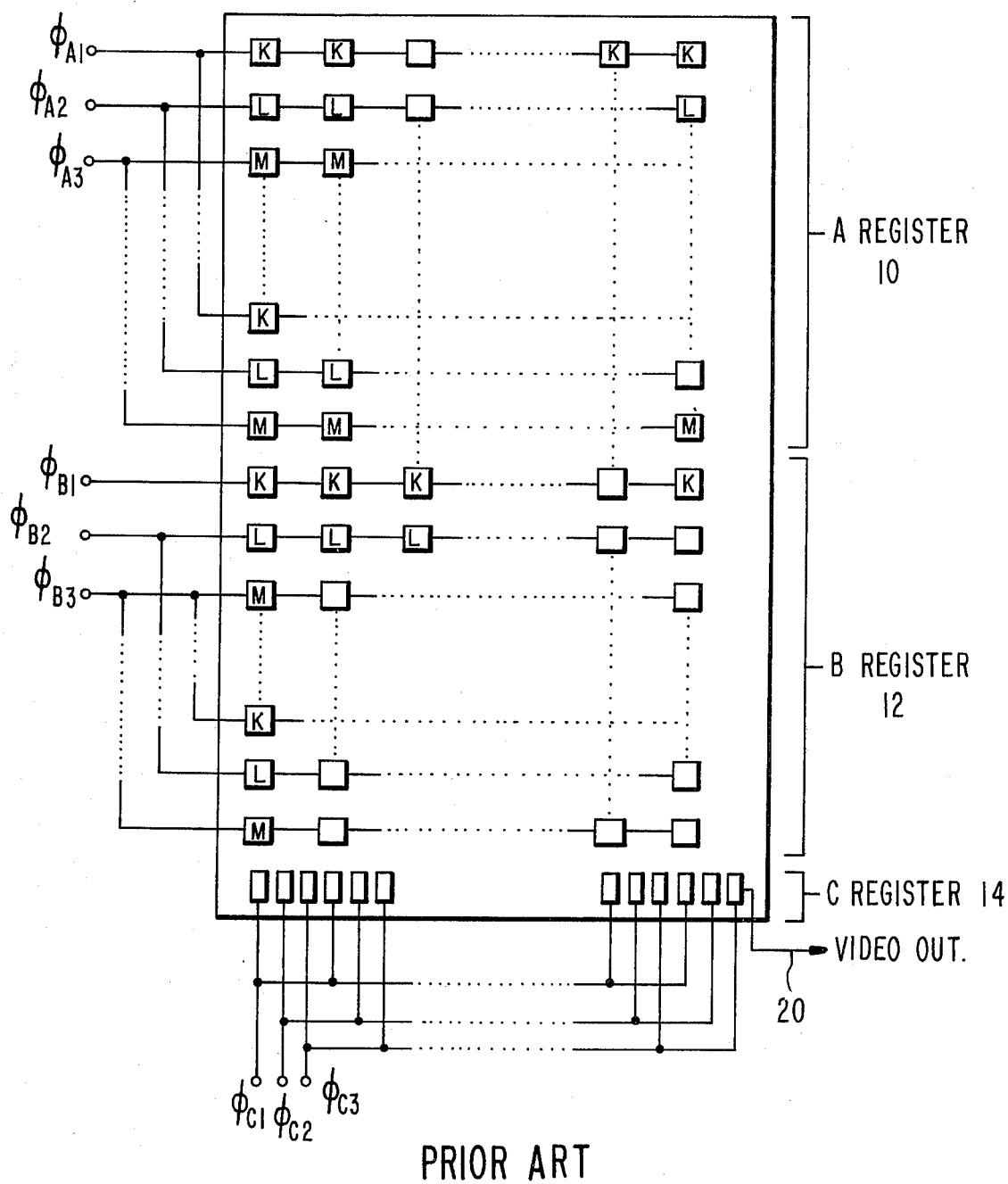
FIG. 1 is a schematic showing of a known (CCD) image sensing system.
Figure 2:
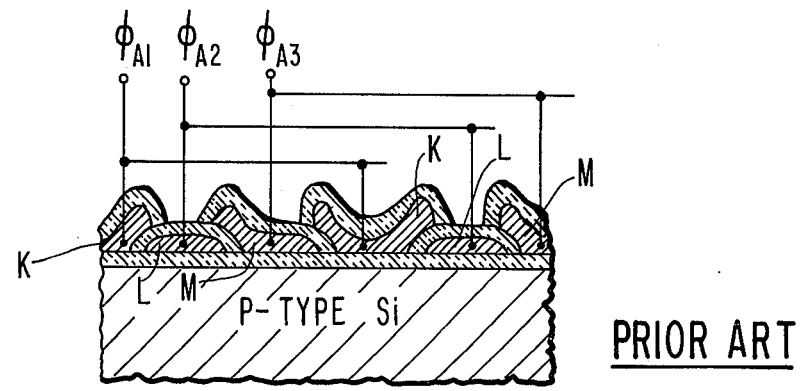
FIG. 2 is a cross section through a portion of a column of the system of FIG. 1.

The known system of FIG. 1 includes a photosensing array 10, a temporary storage array 12 having the same number of locations as the array 10, and an output register 14 having a number of stages equal to the number of locations in a row of the array 10. Elements 10, 12 and 14 are sometimes known as the A, B, and C registers, respectively, and are so legended. Each stage or location comprises three electrodes K, L and M. As shown in FIG. 2, the electrodes may, in a three phase system, all be formed of polysilicon. Many other alternatives are possible.

During the so-called "integration" time, comparable to the exposure time in the camera art, the electrodes K may be held at a voltage level to cause depletion regions to form in the substrate. Electrodes L and M may be held at a voltage level to form potential barriers between the depletion regions. Channel "stops", not shown explicitly, may be present to prevent the charge in one channel from passing to the next channel. Under those conditions, the radiant energy image, such as a light or an infrared image, as examples, projected onto the array causes the generation and accumulation of charge signal at the respective photosensing locations. The number of charge carriers which accumulate at each location during the integration time is proportional to the amount of radiant energy reaching that location and this, in turn, is proportional to the radiation intensity and the duration of the integration time. The array 12 and register 14 are masked to prevent radiation from reaching these structures.

At the termination of the integration time, the charge carriers are shifted from the photosensing array 10 to the temporary storage array 12. The shifting is accomplished, in the example illustrated, by the two sets of three phase voltages $\phi_{A1}, \phi_{A2}, \phi_{A3}$ and $\phi_{B1}, \phi_{B2}, \phi_{B3}$ (Two or four phase operation also would be possible). During this shifting operation, $\phi_{A1} = \phi_{B1}$, $\phi_{A2} = \phi_{B2}$ and $\phi_{A3} = \phi_{B3}$ so that each column of charge signals — each CCD "register" is shifted from array 10 to array 12. After the information detected by the array 10 has been shifted in its entirety to the temporary storage array 12, it is shifted, a line (row) at a time, from the temporary storage array 12 to the output register 14. During the shifting of signals from array 12 to register 14, the photosensing array 10 may be placed in condition again to receive a light image.

The shifting of the contents of array 12 into the register 14 is accomplished by the $\phi_{B1}, \phi_{B2}, \phi_{B3}$ three phase voltages. After each line of information is shifted, in parallel, from array 12 to output register 14, it is then shifted in serial fashion from the output register to the output lead 20 by the three-phase voltages $\phi_{C1}, \phi_{C2}, \phi_{C3}$. These, of course, are at a much higher frequency than the three phase voltages $\phi_{B1}, \phi_{B2}, \phi_{B3}$ to insure that register 14 is emptied before the next line of information arrives.

In practice, the contents of the photosensing array 10 may be shifted into the temporary storage array 12 during the period corresponding to the vertical blanking time in commercial television, that is, during a period such as 900 microseconds. The output register may be loaded during the horizontal retrace time, about 10 microseconds, and its contents shifted to the output terminal a bit at a time, during the horizontal line time −50 microseconds.

In the system of FIG. 1, the integration time is a fixed interval of time roughly equal to one field time. If the scene brightness is very high, overloading may occur and this may result in blooming. Moreover, there is no means provided for stopping action. That is, if during the integration time one of the objects in the scene moves sufficiently rapidly, blurring will occur.

Figure 3:
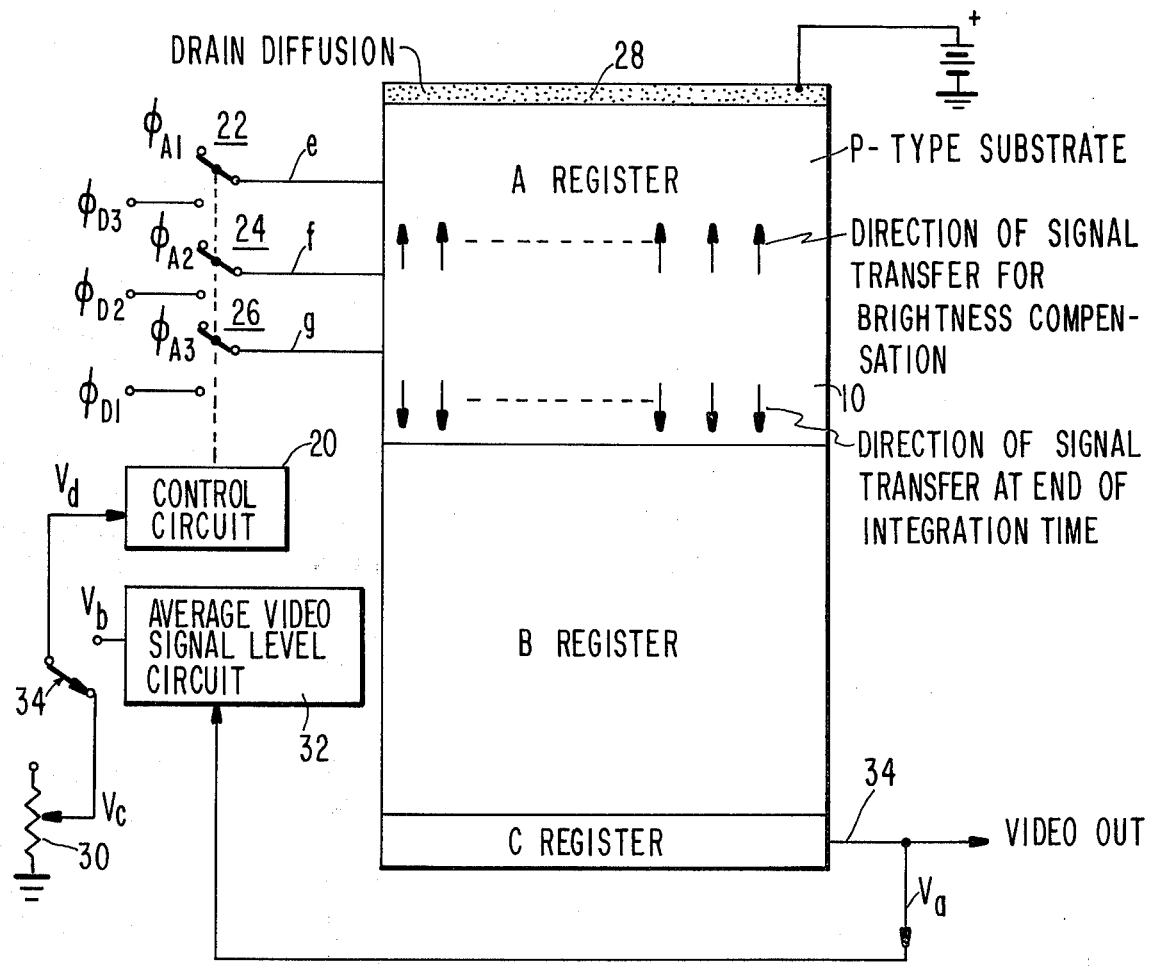
FIG. 3 is a schematic showing of a system embodying the present invention.

FIG. 3 illustrates a system embodying the present invention. To simplify the drawing, the electrodes are not shown. It includes means for controlling the effective duration of the integration time. Such control may be automatic and a function of, for example, the average scene brightness or it may be manual. If the scene brightness is relatively high, the effective duration of the integration time may be reduced sufficiently to stop action.

The system of FIG. 3 includes a control circuit 20 receptive of a voltage $V_d$. The control circuit is shown connected to three mechanically ganged switches 22, 24 and 26. In practice an electronic switching circuit, to be discussed shortly is used instead. The switches are normally in the position shown. In this position, conventional operation is obtained in the sense that during the integration time, charge signals are stored in potential wells as described and upon completion of the integration time, the charge signals are shifted from the A register to the B register.

Figure 8:
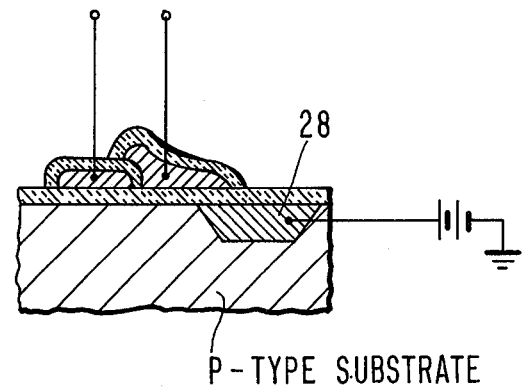
FIG. 8 is a section through the array of FIG. 3 showing the drain region.

When the switches are in the other position, a different type of operation results. Now the three-phase voltages $\phi_{D1}, \phi_{D2}$ and $\phi_{D3}$ are applied in a sense to shift the charge signal in the backward direction. This backward shifting takes place during the integration time and for a portion of the integration time proportional to the magnitude of the voltage $V_d$ applied to the control circuit 20. The charge signals shift to a drain diffusion 28 located along the upper edge of the A register 10. (The actual structure may be as shown in FIG. 8.) Thus, for the first portion, such as one quarter or one half or any other desired fraction of each integration time, the charge accumulated in the A register is transferred out of the A register and discarded. This effectively reduces the exposure time.

The voltage $V_d$ applied to the control circuit may be manually set by the potentiometer 30. However, a preferred alternative is automatic control via feedback from the C register. The video output signal of the C register is sampled as $V_a$ and applied to the average video signal level circuit 32. This circuit includes an integrator and can include amplifiers and it produces an output signal $V_b$ having a DC level proportional to the average amplitude of $V_a$. The switch 34 enables the user to obtain manual or automatic control, as desired.

During the backward transfer of charge toward the drain diffusion 28 and indeed during the entire integration time, the B register is shifting a row at a time into the C register and the content of the C register is being shifted at high speed to the output lead 34 of the C register. It is found, in practice, that if care is not taken in the way in which the backward shifting to the drain diffusion 28 is accomplished, considerable noise is produced which contaminates the video signal at 34. This noise appears on the face of the displays (not shown) such as kinescopes to which the video signals are applied. The noise is believed to be due to feedthrough of the multiple phase $\phi_D$ shift voltages via the substrate to the video output lead 34. In the present invention such noise preferably is avoided by performing the backward shifting only during the horizontal retrace periods ($10\mu$ sec in the case of standard television). The frequency chosen for the $\phi_D$ multiple phase voltages preferably should be sufficiently high that a reasonable number of lines can be shifted during each horizontal retrace period. It has been found, in practice, that a frequency sufficiently high to cause 10 – 15 or a somewhat larger number of rows of charge signal of the A register to shift into the drain region 28, during each 10 microsecond horizontal retrace period of standard television gives good performance.

Figure 4:
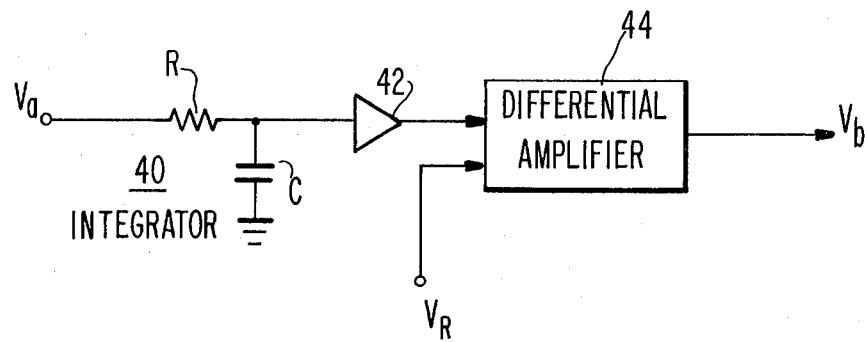
FIG. 4 is a more detailed showing of the average video signal level circuit of FIG. 3.

FIG. 4 illustrates the circuit 32 of FIG. 3. It includes a resistor - capacitor (RC) integrator 40, an amplifier 42 and a differential amplifier 44. The differential amplifier receives at its second input terminal the voltage $V_R$ at a reference level.

In operation, the video signal $V_a$ is integrated at 40. The amplifier 42 supplies an amplified version of the integrated voltage to the differential amplifier 44. The amplifier 44 produces an output voltage $V_b$ proportional to the difference between the reference voltage $V_R$ and the output voltage produced by amplifier 42.

Figure 5:
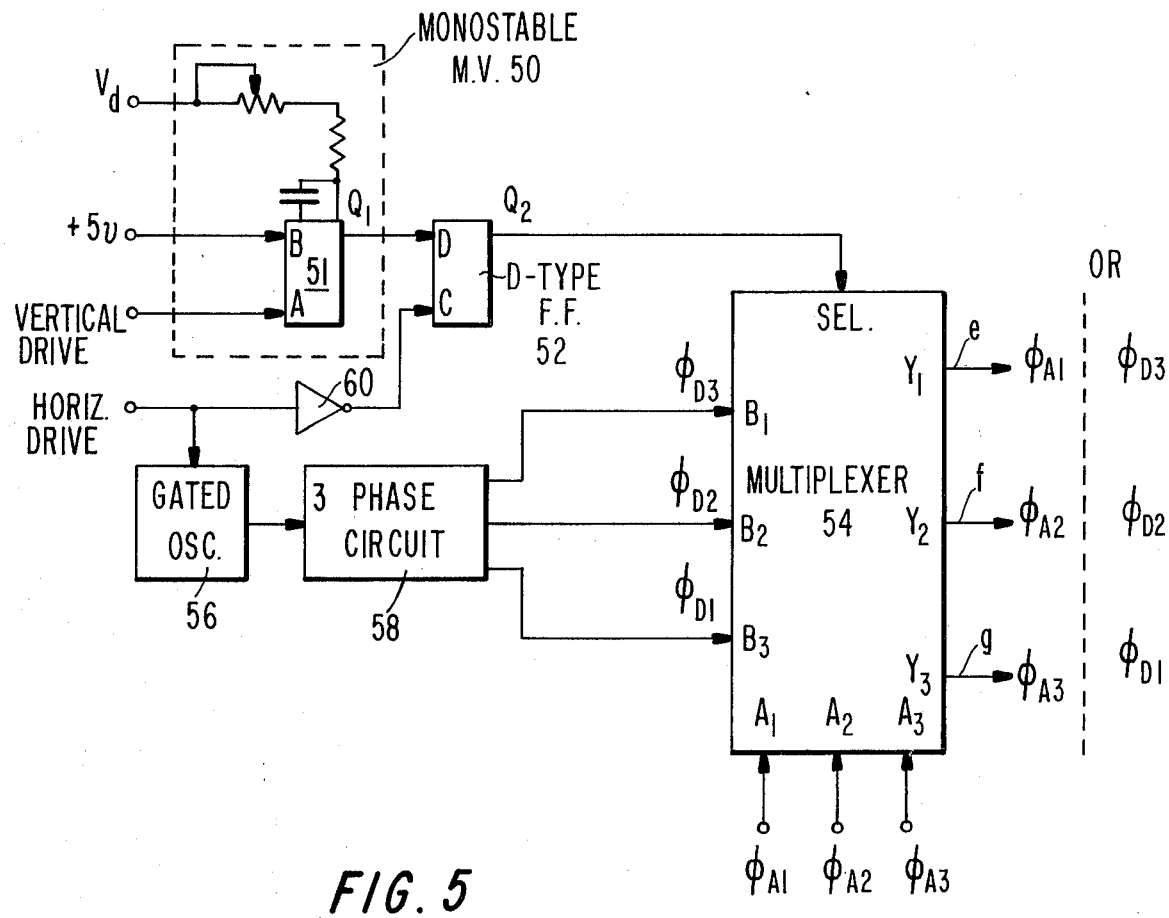
FIG. 5 is a block and schematic diagram of an embodiment of the control circuit of FIG. 3.

FIG. 5 illustrates the control circuit 20 of FIG. 3. The control circuit includes a monostable multivibrator 50 receptive of a voltage $V_d$ which controls the duration of the output pulse produced by the multivibrator 50. The $Q_1$ output terminal of multivibrator 50 connects to the D input terminal of D type flip-flop or bistable multivibrator 52. The $Q_2$ output terminal of flip-flop 52 connects to the select terminal (SEL) of multiplexer 54.

Any one of a number of different circuits may be employed to implement circuits 50 and 52. For example, commercially available integrated circuits Model No. 74123 for block 51 and Model No. 7474 for block 52, both made by Texas Instruments Co., may be used. There are numerous alternatives which also would be suitable.

The circuit of FIG. 5 includes also a gated square wave oscillator 56. This oscillator is gated on in response to the horizontal drive pulse, that is, it is gated on during the 10 microsecond horizontal retrace pulse. The oscillations produced by oscillator 56 are applied to three-phase circuit 58. The latter produces the three-phase output voltages $\phi_{D1}$, $\phi_{D2}$ and $\phi_{D3}$ which are suitable for application to the A register. These are applied to the $B_3$, $B_2$ and $B_1$ input terminals, respectively, of the multiplexer 54. The multiplexer 54 also receives the voltages $\phi_{A1}$, $\phi_{A2}$ and $\phi_{A3}$ at its input terminals $A_1$, $A_2$ and $A_3$.

Any one of a number of different circuits may be employed for circuit 58. As one example, the circuit may comprise a three stage ($2^0$, $2^1$, $2^2$) counter and logic gates for combining the outputs of the second and third stages to provide three signals $2^1 \cdot 2^2$, $2^1 \cdot \overline{2^2}$, and $\overline{2^1} \cdot 2^2$. Each such signal is at a frequency one-third that of the gated oscillator 56. A number of other alternative forms of three phase wave generators would be suitable. The multiplexer may be a commercially available integrated circuit such as Model No. 74157 made by Texas Instruments Co.

Figure 6:
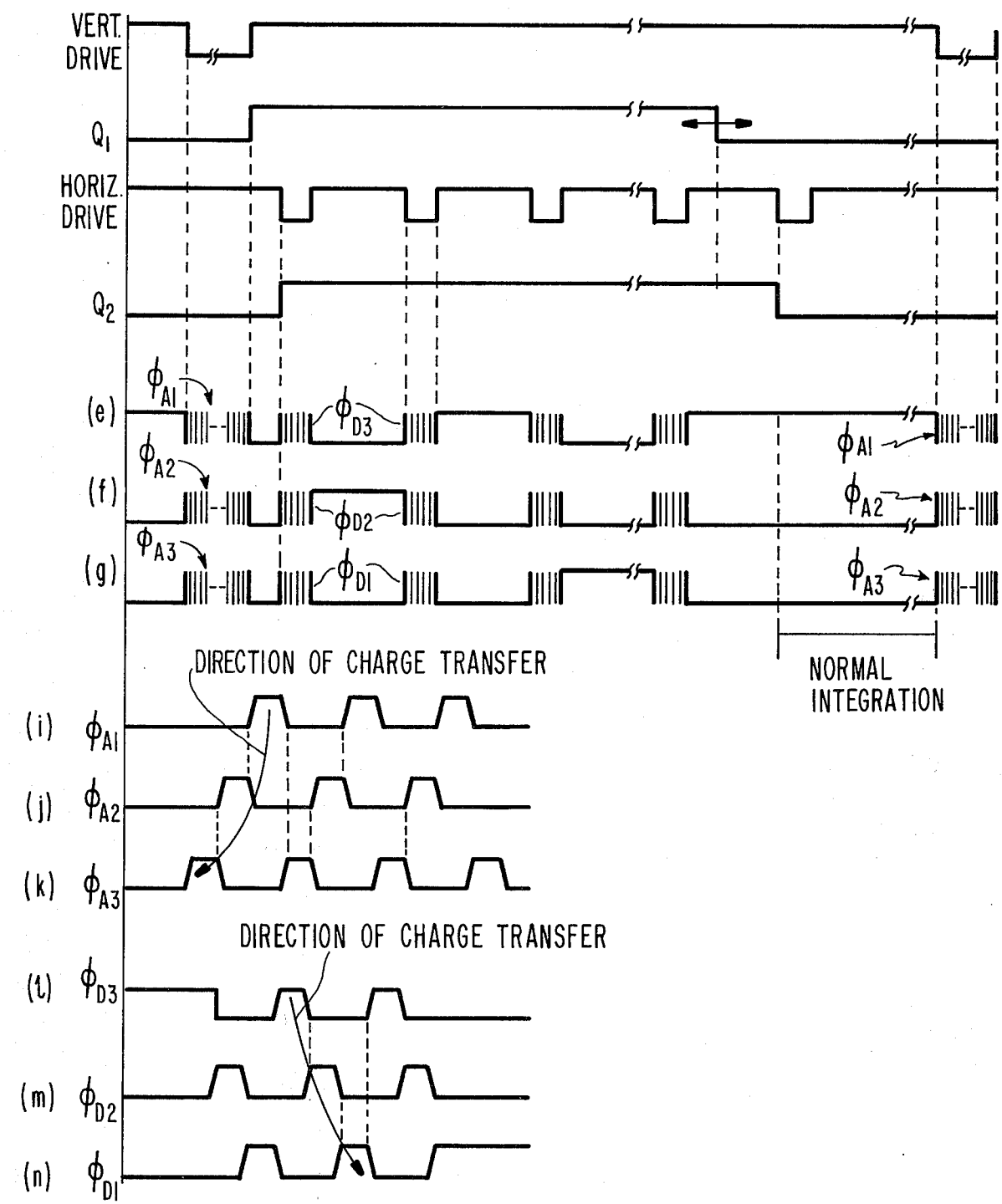
FIG. 6 is a drawing of waveforms to help explain the operation of the invention.

During the discussion of the operation of the circuit of FIG. 5 which follows, both FIGS. 5 and 6 should be referred to. (FIG. 6 is not drawn to scale.) At the termination of the vertical drive retrace time, the monostable circuit 50 is triggered, that is, the positive going edge of the vertical drive signal causes $Q_1$ to go high. The length of time $Q_1$ remains high, that is, the duration of the quasi-stable state of circuit 50, is proportional to the amplitude of $V_d$.

When $Q_1$ goes high, it conditions the D type flip-flop 52 to change state; however, the change in state does not occur until the signal applied to the clock terminal C of the flip-flop goes high. This occurs at the start of the horizontal retrace time, that is, when the horizontal drive signal goes low. The inverter 60 translates this low to a high. When $Q_2$ goes high, the multiplexer 54 connects the $B_1$, $B_2$, $B_3$ input terminals of the multiplexer to the output terminals $Y_1$, $Y_2$ and $Y_3$, respectively, of the multiplexer.

The negative-going horizontal pulse is applied to the gated oscillator 56 and turns this oscillator on. The oscillator drives the three-phase circuit 58 and it produces the three-phase signals shown at $l$, $m$ and $n$ in FIG. 6. Note that these waves are to a different time scale than the waves $e$, $f$ and $g$ in FIG. 6. These same waves $\phi_{D3}$, $\phi_{D2}$ and $\phi_{D1}$ therefore appear at the output terminals of the multiplexer and are applied to the A register. As already mentioned, during a single $10\mu$ sec horizontal retrace period, 10 – 15 periods of the multiple phase $\phi_D$ signals may occur (depending upon the frequency chosen for the gated oscillator 56) and they cause the shifting of 10 – 15 rows, respectively, of charge to the drain diffusion 28 of FIG. 3.

Upon the termination of the horizontal retrace period, the gated oscillator 56 cuts off. The result is that $\phi_{D3}$, $\phi_{D2}$ and $\phi_{D1}$, become DC levels and these appear at the output terminals $Y_1$, $Y_2$ and $Y_3$ of the multiplexer. One of these levels is high and the other two low. These permit charge to accumulate during the 50 $\mu$ sec horizontal line time. However, following this line time, the 10 $\mu$ sec horizontal drive pulse occurs and the same process as previously described occurs, that is, 10 – 15 additional rows of charge signal are shifted from the A register to the drain diffusion.

The process described above continues for so long as the multivibrator 50 output pulse $Q_1$ remains high. In a system operated at commercial TV standards, this may be for 50 to 100 or several hundred of the 525 line times, depending upon the value of $V_D$. When the output signal $Q_1$ goes low, the signal applied to the D input terminal of flip-flop 2 goes low. Now the next horizontal drive pulse which occurs causes C to go high and $Q_2$ thereupon goes low. The low applied to the SEL terminal of multiplexer 54 causes the $A_1$, $A_2$ and $A_3$ input terminals of the multiplexer to connect to the multiplexer output terminals $Y_1$, $Y_2$ and $Y_3$ respectively. As the switching occurs at the start of the horizontal retrace period, "gliches" due to transients are avoided, that is, noise does not appear in the video information which is being displayed.

When the SEL input signal goes low, normal integration resumes. $\phi_{A1}$ is a high so that collection of charge takes place beneath the K electrodes of FIG. 1. $\phi_{A2}$ and $\phi_{A3}$ are low so that potential barriers form in the substrate beneath these electrodes. This collection of charge continues until the start of the 50 microsecond vertical retrace period. At this time, $\phi_{A1}$, $\phi_{A2}$ and $\phi_{A3}$ become multiple phase voltages equal to the multiple phase voltages $\phi_{B1}$, $\phi_{B2}$, $\phi_{B3}$ respectively. These multiple phase voltages transfer the charge integrated in the A register to the B register in the conventional manner as already described. At the termination of this transfer, a new integration period starts and the process already discussed in detail repeats.

Figure 7:
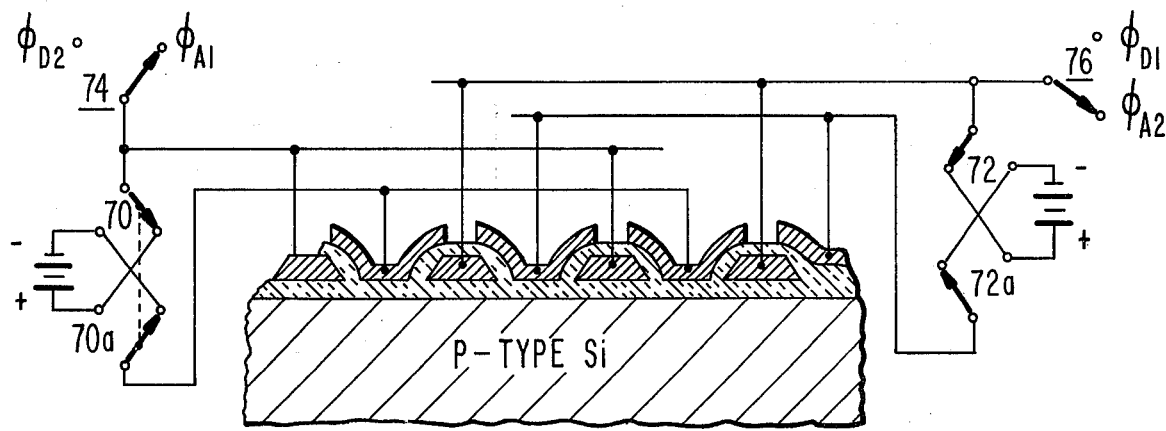
FIG. 7 is a section through the channel of another form of CCD imager which may embody the invention.

While the invention has been described in terms of a three-phase system, this is just an illustration only. It can be applied also to two-phase CCD imager with electrodes such as illustrated in FIG. 7. As is well understood in the art, in order to achieve unidirectional signal propagation, the electrodes must provide asymmetrical potential wells. This is achieved in FIG. 7 by producing a DC offset between each electrode pair. To achieve propagation in one direction (right-to-left) the DC offset is in one sense, that is, switches 70, 70a and 72, 72a are in the positions shown. To achieve signal propagation in the opposite direction, the switches 70, 70a, 72 and 72a are thrown to the other switch position. These switches may be electrically ganged with the switches 74 and 76 so that when the switches are in the position shown, propagation in the forward direction results and the voltages $\phi_{A1}$ and $\phi_{A2}$ are applied to the electrodes. When the switches are in the other position, backward propagation results in the A register and the voltages $\phi_{D1}$ and $\phi_{D2}$ are applied.

While in an embodiment of the invention illustrated, the average value of the video signal is employed to control the value of $V_b$, other parameters may be sensed instead. As one example, a threshold circuit may be employed in the feedback loop and only signals of greater than the threshold level sensed. As another alternative, gate circuits may be employed for passing to circuit 32 only video signals derived from a certain region (such as the center region) of the CCD array 10. This is analagous to what is done in certain forms of photographic exposure meters.

What is claimed is:

1. In combination:
   a charge transfer image sensing array having a plurality of registers of image sensing and storage elements;
   a temporary storage array coupled to said image sensing array at one end of said registers;
   a drain region coupled to said image sensing array at the other end of said registers;
   means during an initial portion of an integration period for shifting the charge pattern being accumulated in said registers in one direction to said drain region; and
   means after said integration period for shifting the charge pattern accumulated in said registers during the remaining portion of said integration period, in the opposite direction to said temporary storage array.

2. In the combination as set forth in claim 1, said image sensing array comprising a semiconductor substrate and electrodes insulated from and electrically coupled to said substrate for storing and propagating charge signals, each register comprising a plurality of said electrodes extending in the column direction, and said drain region comprising a region in the substrate of opposite conductivity than the substrate.

3. The improvement, in a charge transfer imager which includes an image sensing array comprising a plurality of registers, said registers including means during a field time for sensing an image projected onto the image sensing array and storing a charge pattern corresponding thereto, a temporary storage array, an output register, means during each vertical retrace period for shifting the charge pattern in one direction along said registers for transferring the contents of the image sensing array to the temporary storage array, means during each horizontal line retrace period for shifting a row of information into the output register, and means during each horizontal line period for shifting the information stored in the output register out of the output register, of:
   means during an initial portion of each field time for shifting said charge pattern in the opposite direction along said registers for removing from the image sensing array the charge pattern being accumulated thereon.

4. The improvement as set forth in claim 3 further including means responsive to a parameter of the signals shifted out of said output register for controlling the duration of said initial portion of each field time.

5. The improvement as set forth in claim 4 wherein said parameter comprises average amplitude.

6. The combination of:
   a CCD image sensing array adapted to produce and store a charge pattern in response to a radiation image projected thereon during a field time, said array having a plurality of channels extending in the column direction;
   a CCD temporary storage array having a plurality of channels also extending in the column direction coupled at one end to one end of the respective channels of the imaging array;
   a CCD output register coupled to the temporary storage array;
   a drain region coupled to the other end of the channels of the CCD image sensing array;
   means during each vertical retrace period for transferring the contents of the image sensing array in one direction along said channels to said temporary storage array for storage therein;
   means during each horizontal line retrace period for transferring a row of information from said temporary storage array to said output register;
   means during each horizontal line period for transferring the information stored in said output register out of said register a bit at a time; and
   means during the horizontal line retrace periods within an initial portion of each field time for transferring the contents of the image sensing array in the opposite direction along said channels to said drain region.

7. The combination as claimed in claim 6, further including means responsive to the brightness of the image projected onto said image sensing array for controlling the duration of the initial portion of each field time.

8. The improvement, in a charge transfer imager which includes an image sensing array, said image sensing array including means during a field time for sensing an image projected onto the image sensing array and storing a charge pattern corresponding thereto, a temporary storage array, an output register, means during each vertical retrace period for transferring the contents of the image sensing array to the temporary storage array, means during each horizontal line retrace period for shifting a row of information into the output register, and means during each horizontal line period for shifting the information stored in the output register out of the output register of:

means during solely the horizontal line retrace periods of an initial portion of each field time for removing from the image sensing array the charge pattern concurrently being accumulated thereon.

* * * * *